US012787432B2

(12) United States Patent
Luo

(10) Patent No.: US 12,787,432 B2
(45) Date of Patent: Nov. 3, 2026

(54) DISPLAY PANEL INCLUDING ACTIVE LAYER HAVING CONDUCTOR PART AND METHOD OF MANUFACTURING SAME

(71) Applicant: Shenzhen China Star Optoelectronics Semiconductor Display Technology Co., Ltd., Shenzhen (CN)

(72) Inventor: Chuanbao Luo, Shenzhen (CN)

(73) Assignee: Shenzhen China Star Optoelectronics Semiconductor Display Technology Co., Ltd., Shenzhen (CN)

( * ) Notice: Subject to any disclaimer, the term of this patent is extended or adjusted under 35 U.S.C. 154(b) by 953 days.

(21) Appl. No.: 17/271,231

(22) PCT Filed: Dec. 30, 2020

(86) PCT No.: PCT/CN2020/141318
§ 371 (c)(1),
(2) Date: Sep. 26, 2023

(87) PCT Pub. No.: WO2022/141169
PCT Pub. Date: Jul. 7, 2022

(65) Prior Publication Data

US 2024/0038770 A1 Feb. 1, 2024

(30) Foreign Application Priority Data

Dec. 29, 2020 (CN) ......................... 202011594285.8

(51) Int. Cl.
*H10D 86/60* (2025.01)
*H10D 86/01* (2025.01)
(Continued)

(52) U.S. Cl.
CPC ......... *H10D 86/60* (2025.01); *H10D 86/0231* (2025.01); *H10D 86/441* (2025.01); *H10D 86/451* (2025.01); *H10W 90/00* (2026.01)

(58) Field of Classification Search
CPC ............ H10W 86/451; H10D 30/6723; H10D 30/6733; H10D 30/6739; H10D 30/6755;
(Continued)

(56) References Cited

U.S. PATENT DOCUMENTS 7,125,756 B2 10/2006 Oh et al.
2019/0074304 A1* 3/2019 Lee ...................... H10D 86/481

FOREIGN PATENT DOCUMENTS

CN 101771072 7/2010
CN 102194890 9/2011
(Continued)

OTHER PUBLICATIONS

International Search Report and the Written Opinion Dated Aug. 27, 2021 From the International Searching Authority Re. Application No. PCT/CN2020/141318 and Its Translation Into English. (13 Pages).

(Continued)

*Primary Examiner* — Hoai V Pham

(57) ABSTRACT

The embodiments of the application disclose a display panel and a method of manufacturing same. In the display panel, an active layer includes a first part, a second part, a conductor part, and a channel part. The conductor part is disposed between the first part and the second part and is connected to the channel part. A first metal layer includes a gate electrode, which overlaps the channel part. A second metal layer includes a source electrode and a drain electrode, the source electrode is connected to the first part, and the drain electrode is connected to the second part.

19 Claims, 9 Drawing Sheets

(51) Int. Cl.
*H10D 86/40* (2025.01)
*H10W 90/00* (2026.01)

(58) Field of Classification Search
CPC ........... H10D 30/6757; H10D 86/0231; H10D 86/423; H10D 86/441; H10D 86/451; H10D 86/60
See application file for complete search history.

(56) References Cited

FOREIGN PATENT DOCUMENTS

| | | | | |
|---|---|---|---|---|
| CN | 103499906 | | 1/2014 | |
| CN | 203521413 | | 4/2014 | |
| CN | 203871327 | | 10/2014 | |
| CN | 104916779 | | 9/2015 | |
| CN | 105489655 | | 4/2016 | |
| CN | 105518845 | | 4/2016 | |
| CN | 107851669 | | 3/2018 | |
| CN | 109887933 | | 6/2019 | |
| CN | 111446259 | | 7/2020 | |
| CN | 112487849 A | * | 3/2021 | ........... G06V 10/145 |

OTHER PUBLICATIONS

Notification of Office Action and Search Report Dated Aug. 2, 2022 From the State Intellectual Property Office of the People's Republic of China Re. Application No. 202011594285.8 and Its Translation Into English. (22 Pages).

Notification of Office Action and Search Report Dated Apr. 19, 2023 From the State Intellectual Property Office of the People's Republic of China Re. Application No. 202011594285.8 and Its Translation Into English. (20 Pages).

* cited by examiner

DISPLAY PANEL INCLUDING ACTIVE LAYER HAVING CONDUCTOR PART AND METHOD OF MANUFACTURING SAME

RELATED APPLICATIONS

This application is a National Phase of PCT Patent Application No. PCT/CN2020/141318 having International filing date of Dec. 30, 2020, which claims the benefit of priority of Chinese Patent Application No. 202011594285.8 filed on Dec. 29, 2020. The contents of the above applications are all incorporated by reference as if fully set forth herein in their entirety.

FIELD AND BACKGROUND OF THE INVENTION

The present invention relates to the field of display technology and in particular to a display panel and a method of manufacturing same.

During research and practice of the prior art, inventor of the present invention found that a current required for a light-emitting device in a current-driven panel is relatively high. In order to meet requirement, a thin film transistor with a large aspect ratio is generally designed. However, on a condition that a length of a channel is fixed, the greater a channel width, the more serious a self-heating effect of the thin film transistor, which affects reliability of the thin film transistor.

SUMMARY OF THE INVENTION

Technical Problem

Embodiments of the present invention provide a display panel and a method of manufacturing same, which can improve the reliability of the thin film transistor.

Technical Solution

An embodiment of the present invention provides a display panel comprising:

a substrate;

an active layer disposed on the substrate, wherein the active layer comprises a first part, a second part, a conductor part, and a channel part, the first part is disposed on one side of the channel part, the second part is disposed on another side of the channel part, the conductor part is disposed between the first part and the second part and is connected to the channel part, and a material of the active layer comprises metal oxides;

a first metal layer disposed on the substrate and disposed in a different layer from the active layer, wherein the first metal layer comprises a gate electrode, and the gate electrode overlaps the channel part; and a second metal layer disposed on the substrate and disposed in a different layer from the first metal layer, wherein the second metal layer comprises a source electrode and a drain electrode, the source electrode is connected to the first part, and the drain electrode is connected to the second part;

wherein the first metal layer comprises a first sublayer, a second sublayer, and a third sublayer laminated in sequence, and chemical potentials of the first sublayer and the third sublayer are both greater than that of the second sublayer.

Alternatively, in some embodiments of the present invention, a number of the conductor parts is plurality, and a plurality of the conductor parts are arranged in a matrix.

Alternatively, in some embodiments of the present invention, the channel part comprises a plurality of sub-channels, and the sub-channels and the conductor parts are alternately arranged in an extending direction from the first part to the second part in the active layer.

Alternatively, in some embodiments of the present invention, the gate electrode is provided with openings corresponding to the conductor parts; and the first metal layer further comprises a scan line, the gate electrode comprises at least two sub-gate electrodes, one of the openings is arranged between two adjacent sub-gate electrodes, the sub-gate electrodes overlap the channel part, and the scan line is connected to the at least two sub-gate electrodes.

The embodiments of the present invention further provide a display panel comprising:

a substrate;

an active layer disposed on the substrate, wherein the active layer comprises a first part, a second part, a conductor part, and a channel part, the first part is disposed on one side of the channel part, the second part is disposed on another side of the channel part, and the conductor part is disposed between the first part and the second part and is connected to the channel part;

a first metal layer disposed on the substrate and disposed in a different layer from the active layer, wherein the first metal layer comprises a gate electrode, and the gate electrode overlaps the channel part; and a second metal layer disposed on the substrate and disposed in a different layer from the first metal layer, wherein the second metal layer comprises a source electrode and a drain electrode, the source electrode is connected to the first part, and the drain electrode is connected to the second part.

Alternatively, in some embodiments of the present invention, a number of the conductor parts is plurality, and a plurality of the conductor parts are arranged in a matrix.

Alternatively, in some embodiments of the present invention, a number of the conductor parts is single.

Alternatively, in some embodiments of the present invention, the channel part comprises a plurality of sub-channels, and the sub-channels and the conductor parts are alternately arranged in an extending direction from the first part to the second part in the active layer.

Alternatively, in some embodiments of the present invention, the gate electrode is provided with openings corresponding to the conductor parts.

Alternatively, in some embodiments of the present invention, the first metal layer further comprises a scan line, the gate electrode comprises at least two sub-gate electrodes, one of the openings is arranged between two adjacent sub-gate electrodes, the sub-gate electrodes overlap the channel part, and the scan line is connected to the at least two sub-gate electrodes.

Alternatively, in some embodiments of the present invention, the first metal layer comprises a first sublayer, a second sublayer, and a third sublayer laminated in sequence, and chemical potentials of the first sublayer and the third sublayer are both greater than that of the second sublayer.

Alternatively, in some embodiments of the present invention, thicknesses of the first sublayer and the third sublayer are both less than that of the second sublayer.

Alternatively, in some embodiments of the present invention, the display panel further comprises a first light-shielding layer, a buffer layer, an insulating layer, an interlayer dielectric layer, a first passivation layer, an electrode layer, a second passivation layer, and a second light-shielding layer;

the first light-shielding layer, the buffer layer, the active layer, the insulating layer, the first metal layer, the interlayer dielectric layer, the second metal layer, the first passivation layer, the electrode layer, the second passivation layer, and the second light-shielding layer are sequentially laminated on the substrate;

both the first light-shielding layer and the second light-shielding layer overlap the active layer; and the second metal layer further comprises a conductive pad, one of the source electrode or the drain electrode is electrically connected to the conductive pad, the other one of the source electrode or the drain electrode is electrically connected to the first light-shielding layer, the electrode layer comprises a first electrode, and the first electrode is disposed on the conductive pad.

Alternatively, in some embodiments of the present invention, the display panel further comprises a buffer layer, an insulating layer, an interlayer dielectric layer, a first passivation layer, an electrode layer, a second passivation layer, and a light-shielding layer;

the buffer layer, the first metal layer, the insulating layer, the active layer, the interlayer dielectric layer, the second metal layer, the first passivation layer, the electrode layer, the second passivation layer, and the light-shielding layer are sequentially laminated on the substrate; and the light-shielding layer and the active layer are overlapped, the second metal layer further comprises a conductive pad, the conductive pad is electrically connected to the source electrode or the drain electrode, the electrode layer comprises a first electrode, and the first electrode is disposed on the conductive pad.

Alternatively, in some embodiments of the present invention, the display panel comprises a light-emitting device, and the light-emitting device is electrically connected to the conductive pad.

Alternatively, in some embodiments of the present invention, a side of the active layer facing the first metal layer is doped with fluorine-based groups.

Correspondingly, the embodiments of the present invention further provide a method of manufacturing a display panel, which comprises following steps:

forming an active layer on a substrate, wherein the active layer comprises a first part, a second part, a conductor part, and a channel part, the first part is disposed on one side of the channel part, and the second part is disposed on another side of the channel part, and the conductor part is disposed between the first part and the second part and is connected to the channel part;

forming a first metal layer on the substrate, wherein the first metal layer comprises a gate electrode, and the gate electrode partially overlaps the channel part; and forming a second metal layer on the substrate, wherein the second metal layer comprises a source electrode and a drain electrode, the source electrode is connected to the first part, and the drain electrode is connected to the second part.

Alternatively, in some embodiments of the present invention, forming the first metal layer on the substrate comprises following steps:

depositing a metal layer on the substrate; and patterning the metal layer by a wet etching process or a metal lift-off process to form a first metal layer, wherein the gate electrode is provided with openings.

Alternatively, in some embodiments of the present invention, forming the active layer on the substrate comprises following steps:

depositing a metal oxide layer on the substrate, and patterning the metal oxide layer to form a metal oxide patterned layer; and using the gate electrode as a mask and conductorizing the metal oxide patterned layer to form the active layer, wherein the opening corresponds to the conductor part, the channel part corresponds to the gate electrode, the first part is disposed on one side of the channel part, and the second part is disposed on another side of the channel part.

Alternatively, in some embodiments of the present invention, the metal oxide patterned layer is irradiated with a laser to conductorize a portion of the metal oxide patterned layer corresponding to the opening and a portion disposed on both sides of the gate electrode, so as to form the conductor part, the first part, the second part and the channel part.

Alternatively, in some embodiments of the present invention, the gate electrode comprises sub-gate electrodes, and one of the openings is arranged between two adjacent sub-gate electrodes;

the channel part comprises sub-channels, and the sub-channels and the conductor parts are alternately arranged in an extending direction from the first part to the second part in the active layer; and the sub-gate electrodes and the sub-channels are overlapped, and the opening corresponds to the conductor part.

Alternatively, in some embodiments of the present invention, the method further comprises following steps:

sequentially forming a first light-shielding layer and a buffer layer on the substrate;

forming an insulating layer on the substrate;

forming an interlayer dielectric layer on the first metal layer; and sequentially forming a first passivation layer, an electrode layer, a second passivation layer, and a second light-shielding layer on the second metal layer;

wherein forming the second metal layer on the substrate comprises following steps:

etching the interlayer dielectric layer, the insulating layer, and the buffer layer by fluorine-based oxidizing gas to form a first via hole exposing the first light-shielding layer and two second via holes exposing the first part and the second part; and depositing a metal layer on the interlayer dielectric layer to fill the first via hole and the second via holes, and patterning the metal layer to form the second metal layer, wherein the second metal layer further comprises a conductive pad, the source electrode is electrically connected to the first light-shielding layer through the first via hole, the source electrode is connected to the first part through one of the second via holes, the drain electrode is connected to the second part through the other one of the second via holes, and the conductive pad is electrically connected to the drain electrode.

Alternatively, in some embodiments of the present invention, energy density of the laser ranges from 100 to 250 $mJ/cm^2$.

Advantageous Effect

In the embodiments of the present invention, the active layer is subjected to a conductorizing treatment except for the parts connecting the source electrode and the drain electrode, so as to form a conductor part, thereby reducing a width of the channel part, and further realizing a process of narrowing the channel part of the thin film transistor.

BRIEF DESCRIPTION OF THE SEVERAL VIEWS OF THE DRAWINGS

In order to explain the technical solutions in the present invention more clearly, the following will introduce briefly the drawings used in the description of the embodiments. Obviously, the drawings in the following description are merely several embodiments of the present invention. For those skilled in the art, other drawings can be obtained based on these drawings without creative work.

DESCRIPTION OF SPECIFIC EMBODIMENTS OF THE INVENTION

Figure 1:
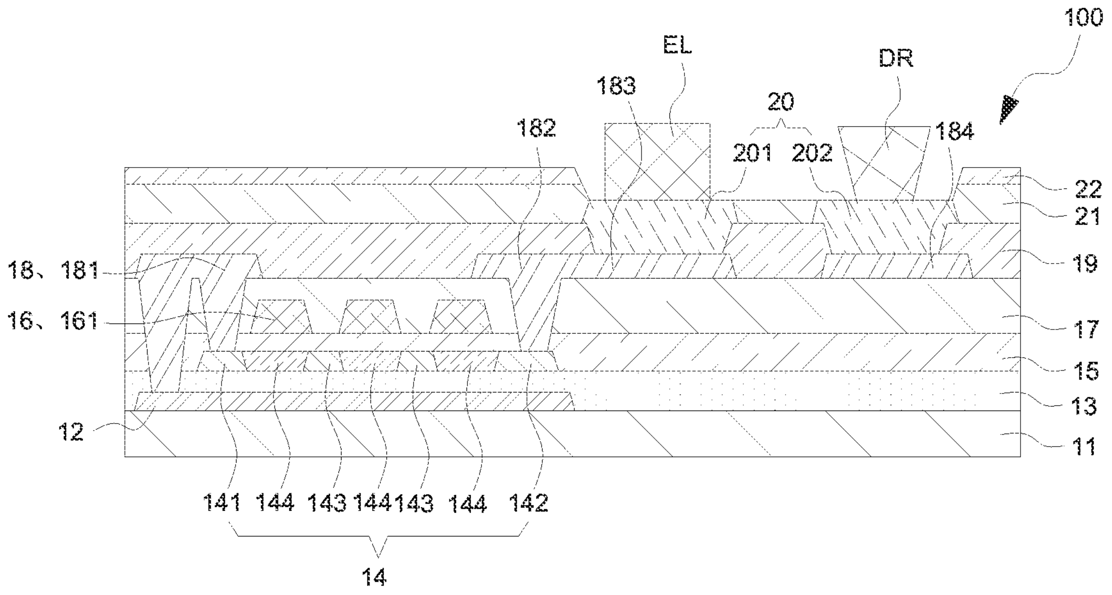
FIG. 1 is a schematic structural view of a display panel in accordance with a first embodiment of the present invention.

The technical solutions in the embodiments of the present invention will be described clearly and completely hereinafter with reference to the accompanying drawings. Apparently, the described embodiments are merely a part of but not all embodiments of the present invention. All other embodiments obtained by those skilled in the art based on the embodiments of the present invention belong to the protecting scope of the present invention. In addition, it should be understood that the specific embodiments described herein are merely for describing and explaining the present invention, and the present invention is not limited thereto. In the present invention, unless otherwise stated, orientation terms used such as "upper" and "lower" generally refer to the upper and lower directions of a device in actual use or working state, and specifically refer to drawing directions in the drawings; while "inner" and "outer" refer to an outline of the device.

The embodiments of the present invention provide a display panel and a method of manufacturing same, which will be described in detail below. It should be noted that the description order of the following embodiments is not intended to limit the preferred order of the embodiments. In addition, the display panel of the embodiments can be used as a direct display panel or a backlight panel.

Referring to FIG. 1, FIG. 1 is a schematic structural view of a display panel in accordance with a first embodiment of the present invention. The display panel 100 provided by the first embodiment of the present invention comprises a substrate 11, and a first light-shielding layer 12, a buffer layer 13, an active layer 14, an insulating layer 15, a first metal layer 16, an interlayer dielectric layer 17, a second metal layer 18, a first passivation layer 19, an electrode layer 20, a second passivation layer 21, and a second light-shielding layer 22 sequentially laminated on the substrate 11, and the display panel 100 further comprises a light-emitting device EL and a driving device DR. Both the light-emitting device EL and the driving device DR are disposed on the electrode layer 20. Both the light-emitting device EL and the driving device DR are electrically connected to the electrode layer 20.

Alternatively, the light-emitting device EL may be an organic light-emitting diode or a micro light-emitting diode chip. The driving device DR may be a chip on film or a driving chip.

Specifically, the first light-shielding layer 12 and the second light-shielding layer 22 overlap the active layer 14 to prevent light from irradiating the active layer 14 and improve stability of the thin film transistor. That is, the active layer 14, the insulating layer 15, the first metal layer 16, the interlayer dielectric layer 17, and the second metal layer 18 constitute a thin film transistor structural layer.

The active layer 14 is disposed on the substrate 11. The active layer 14 comprises a first part 141, a second part 142, a conductor part 143, and a channel part 144. The first part 141 is disposed on one side of the channel part 144. The second part 142 is disposed on another side of the channel part 144. The conductor part 143 is disposed between the first part 141 and the second part 142 and is connected to the channel part 144.

Figure 2:
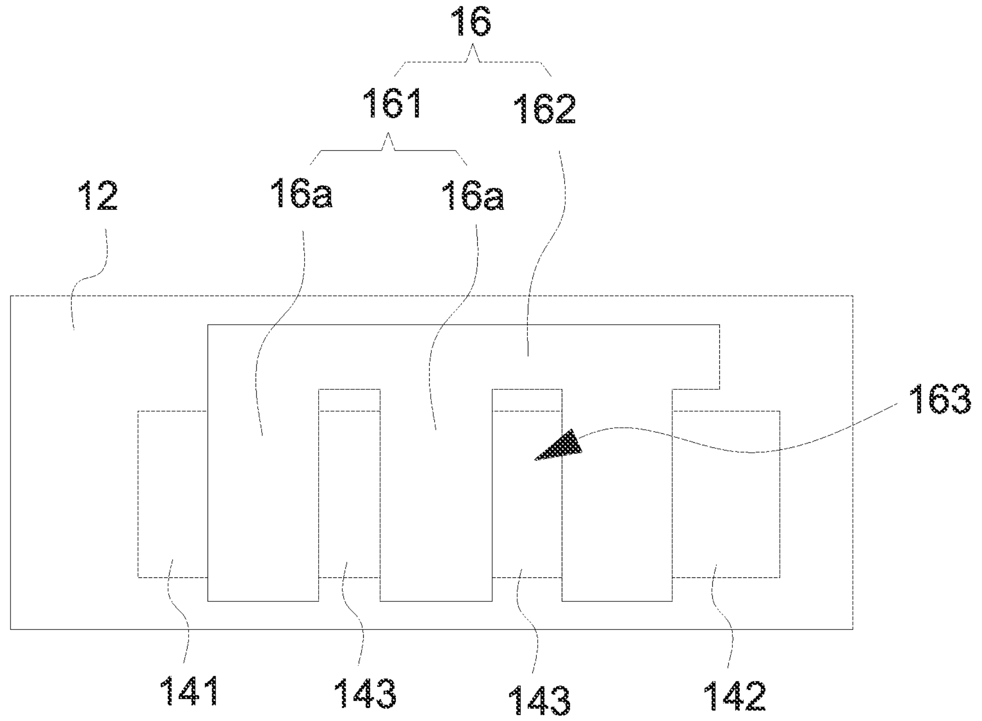
FIG. 2 is a schematic plan view of a first light-shielding layer, an active layer, and a first metal layer of the display panel in accordance with the first embodiment of the present invention.
Figure 3:
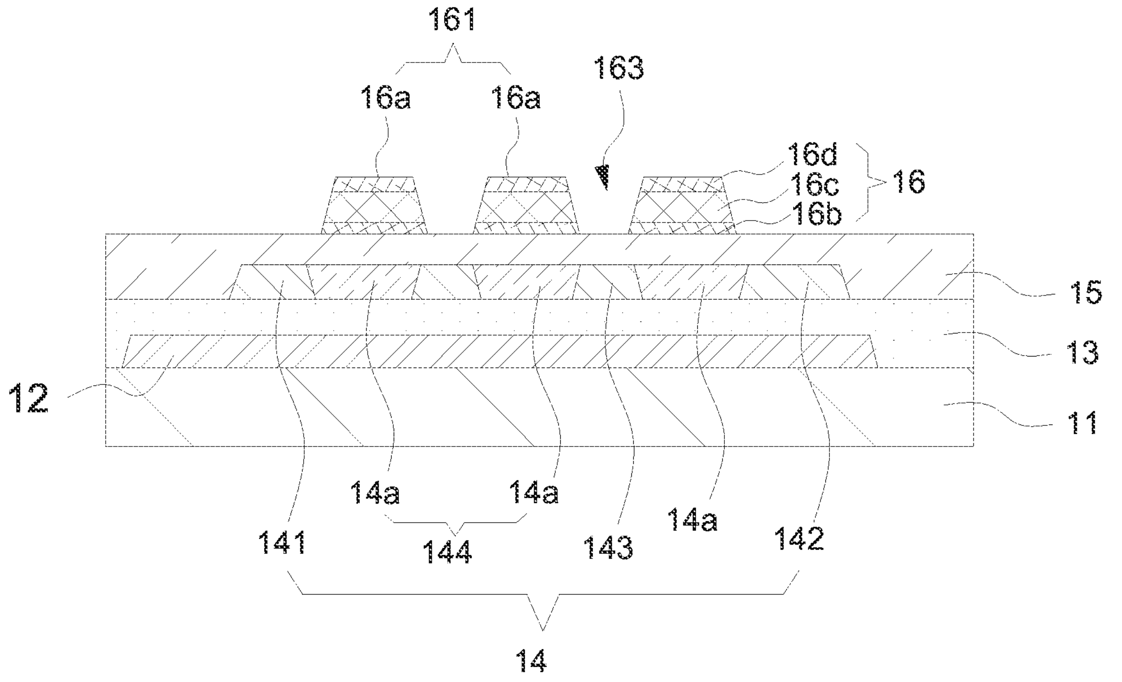
FIG. 3 is a schematic structural view of part of the layers of the display panel in accordance with the first embodiment of the present invention.

Alternatively, referring to FIGS. 2 and 3, the conductor parts 143 are arranged in a matrix. Specifically, a number of the conductor parts 143 is plural, and a plurality of the conductor parts 143 are arranged in a matrix. In this embodiment, the number of conductor parts 143 is two as an example for description, but it is not limited to this.

The channel part 144 comprises a plurality of sub-channels 14*a*. The sub-channels 14*a* and the conductor parts 143 are alternately arranged in an extending direction from the first part 141 to the second part 142 in the active layer 14.

That is, the conductor parts 143 are arranged in a row and a column, and a sub-channel 14*a* is connected between two adjacent conductor parts 143.

Figure 4:
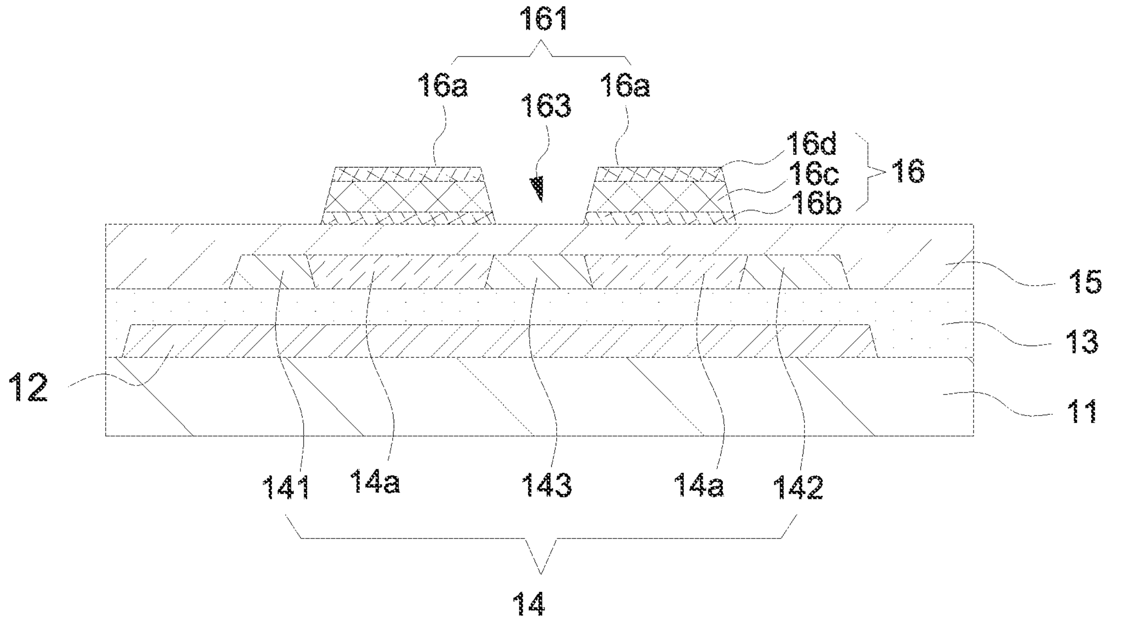
FIG. 4 is another schematic structural view of part of the layers of the display panel in accordance with the first embodiment of the present invention.

In some embodiments, referring to FIG. 4, a number of the conductor part 143 is one. A number of sub-channels 14*a* is two. The conductor part 143 is connected between the two sub-channels 14*a*.

In some embodiments, the conductor parts 143 may also be arranged in M rows and N columns, wherein M≥2, N≥2, and M and N are both integers. The two adjacent conductor parts 143 are arranged at intervals. The channel part 144 is connected between the two adjacent conductor parts 143.

In the display panel 100 of the first embodiment, the active layer 14 is subjected to conductorizing treatment except for parts connecting a source electrode 181 and a drain electrode 182, so as to form the conductor part 143, thereby reducing a width of the channel part 144, and further realizing a process of narrowing the channel of the thin film transistor.

In addition, dividing the channel of the conductor part 143 into a plurality of relatively independent sub-channels 14*a* improves signal transmission efficiency and stability between the source electrode 181 and the drain electrode 182.

Alternatively, a material of the active layer 14 comprises metal oxides, such as indium gallium zinc oxide, indium gallium tin oxide, and indium gallium zinc tin oxide. A thickness of the active layer 14 ranges from 400 angstroms to 800 angstroms. Alternatively, the thickness of the active layer 14 is 400 angstroms, 500 angstroms, 600 angstroms, 700 angstroms, or 800 angstroms.

In some embodiments, a side of the active layer 14 facing the first metal layer 16 is doped with fluorine-based groups, so as to form a fluorine-based thin film on the active layer 14 for suppressing an influence of hydrogen diffusion on the channel in subsequent processes.

The active layer 14 is doped with fluorine-based groups by using a chemical vapor method, and reaction gases may be fluorine-based gases such as $NF_3$.

The insulating layer 15 covers the active layer 14 and the buffer layer 13. The insulating layer 15 can be made of $SiO_x$, $SiO_x/SiN_x$ lamination, or $SiO_x/SiN_x/Al_2O_3$ lamination, and its thickness ranges from 2000 angstroms to 5000 angstroms. Alternatively, the thickness of the insulating layer 15 is 2000 angstroms, 3000 angstroms, 3500 angstroms, 4000 angstroms, and 5000 angstroms.

Referring to FIGS. 2 and 3, the first metal layer 16 is disposed on the substrate 11 and is disposed in a different layer from the active layer 14. The first metal layer 16 comprises a gate electrode 161 and a scan line 162. The scan line 162 is connected to the gate electrode 161. The gate electrode 161 and the channel part 144 are overlapped.

It should be noted that the overlapping arrangement may be a direct overlapping arrangement or an indirect overlapping arrangement. In the present invention, the gate electrode 161 and the active layer 14 are indirectly overlapped.

The gate electrode 161 is defined with openings 163. The openings 163 correspond to the conductor part 143, i.e., the openings 163 expose the conductor parts 143.

The gate electrode 161 comprises at least two sub-gate electrodes 16*a*. An opening 163 is arranged between two adjacent sub-gate electrodes 16*a*. The sub-gate electrodes 16*a* overlap the channel part 144. The scan line 162 is connected to the at least two sub-gate electrodes 16*a*.

Specifically, the sub-gate electrodes 16*a* overlap the sub-channels 14*a*. The openings 163 expose the conductor parts 143 in a one-to-one correspondence. The opening 163 separates the gate electrodes 161 into at least two relatively independent sub-gate electrodes 16*a*, thereby forming segmented gate electrodes 161. Moreover, the segmented gate electrodes 161 are used in the first embodiment to facilitate subsequent processes of forming the conductorized active layer 14 and further facilitate connection of source and drain signals in the thin film transistor.

The display panel 100 of the first embodiment uses openings 163 on the gate electrode 161 to expose a metal oxide patterned layer when the conductorized active layer 14 is formed, so that laser can penetrate the openings 163 to irradiate the metal oxide patterned layer to realize conductorization.

It should be noted that the term "conductorize" means that a metal oxidation bond in the metal oxide patterned layer of a non-channel part is broken due to energy absorption, and more oxygen vacancies are generated to achieve a conductive effect.

Alternatively, the first metal layer 16 comprises a first sublayer 16*b*, a second sublayer 16*c*, and a third sublayer 16*d* laminated in sequence. Chemical potentials of the first sublayer 16*b* and the third sublayer 16*d* are both greater than a chemical potential of the second sublayer 16*c*. This arrangement makes the first sublayer 16*b* and the second sublayer 16*c* form a primary cell in an etching solution when the first metal layer 16 is wet-etched, and the second sublayer 16*c* and the third sublayer 16*d* form another primary cell in the etching solution, thereby suppressing an etching rate of the second sublayer 16*c* and reducing an etching amount of the first metal layer 16.

Alternatively, materials of the first sublayer 16*b* and the third sublayer 16*d* are selected from one of molybdenum (Mo), titanium (Ti), or nickel (Ni), or an alloy of any two thereof. A material of the second sub-layer 16*c* may be copper (Cu) or other metals.

Alternatively, thicknesses of the first sublayer 16*b* and the third sublayer 16*d* are both less than a thickness of the second sublayer 16*c*. This arrangement meets a requirement of low resistance of the scan lines 162 and other wirings.

Alternatively, the thickness of the first sublayer 16*b* ranges from 100 angstroms to 800 angstroms. Alternatively, the thickness of the first sublayer 16*b* is 100 angstroms, 300 angstroms, 500 angstroms, or 800 angstroms. The thickness of the third sublayer 16*d* ranges from 50 angstroms to 200 angstroms. Alternatively, the thickness of the third sublayer 16*d* is 50 angstroms, 100 angstroms, 150 angstroms, or 200 angstroms.

The second metal layer 18 is disposed on the substrate 11 and is disposed in a different layer from the active layer 14 and the first metal layer 16. The second metal layer 18 comprises a source electrode 181, a drain electrode 182, a conductive pad 183, and a terminal pad 184.

The source electrode 181 is connected to the first part 141. The drain electrode 182 is connected to the second part 142. One of the source electrode 181 or the drain electrode 182 is electrically connected to the conductive pad 183. The other one of the source electrode 181 or the drain electrode 182 is electrically connected to the first light-shielding layer 12.

In the display panel 100 of the first embodiment, the source electrode 181 is electrically connected to the first light-shielding layer 12, and the drain electrode 182 is electrically connected to the conductive pad 183. The conductive pad 183 is used to bond the light-emitting device EL. The terminal pad 184 is used to bond a chip on film or a driving chip.

The first passivation layer 19 covers the second metal layer 18 and the interlayer dielectric layer 17, and exposes the conductive pad 183 and the terminal pad 184.

The electrode layer 20 comprises a first electrode 201 and a second electrode 202. The first electrode 201 is connected to the conductive pad 183. The second electrode 202 is connected to the terminal pad 184. The light-emitting device EL is connected to the first electrode 201, and the driving device DR is connected to the second electrode 202.

The second passivation layer 21 covers the electrode layer 20 and the first passivation layer 19 and exposes the first electrode 201 and the second electrode 202.

Materials of the first passivation layer 19 and the second passivation layer 21 can be inorganic non-metal film material of $SiO_x$, $SiO_x/SiN_x$ lamination, or $SiO_x/SiN_x/Al_2O_3$ lamination.

Figure 5:
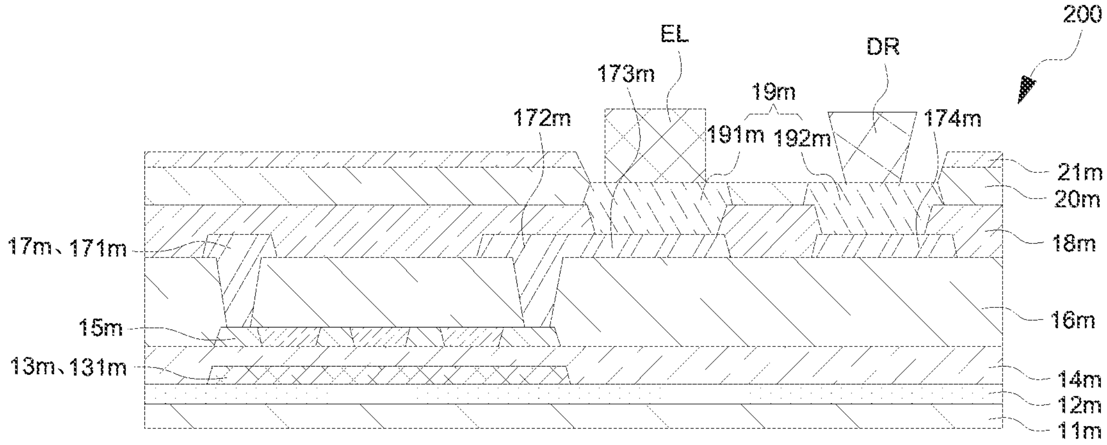
FIG. 5 is a schematic structural view of a display panel in accordance with a second embodiment of the present invention.

Referring to FIG. 5, FIG. 5 is a schematic structural view of a display panel in accordance with a second embodiment of the present invention. The display panel 200 provided by the second embodiment of the present invention comprises a substrate 11*m*, and a buffer layer 12*m*, a first metal layer 13*m*, an insulating layer 14*m*, an active layer 15*m*, an interlayer dielectric layer 16*m*, a second metal layer 17*m*, a first passivation layer 18*m*, an electrode layer 19*m*, a second passivation layer 20*m*, and a light-shielding layer 21*m* sequentially laminated on the substrate 11*m*.

The light-shielding layer 21*m* overlaps the active layer 15*m*. The second metal layer 17*m* comprises a source electrode 171*m*, a drain electrode 172*m*, a conductive pad 173*m*, and a terminal pad 174*m*. The conductive pad 173*m* is electrically connected to the drain 172*m*. The electrode layer 19*m* comprises a first electrode 191*m* and a second electrode 192*m*. The first electrode 191*m* is disposed on the conductive pad 173*m*. The second electrode 192*m* is disposed on the terminal pad 174*m*.

A difference between the display panel 200 of the second embodiment and the display panel 100 of the first embodiment is that the display panel 200 of the second embodiment has the first metal layer 13*m* disposed below the active layer 15*m*, i.e., the display panel 200 of the second embodiment is a bottom gate type thin film transistor display panel, while the display panel 100 of the first embodiment is a top gate type thin film transistor display panel.

Since the display panel 200 of the second embodiment adopts bottom gate type thin film transistors, the gate electrode 131*m* of the first metal layer 13*m* is used to shield the bottom of the active layer 15*m*, thereby saving a first light-shielding layer.

In the manufacturing process of the display panel 200 of the second embodiment, a patterned photoresist layer can be used as a mask to form the conductorized active layer 15*m*. That is, the photoresist layer is used to shield a channel, and openings in the photoresist layer are used to expose a metal oxide patterned layer to be conductorized.

It should be noted that a structure of the display panel 200 of the second embodiment is similar to or same as a structure of the display panel 100 of the first embodiment. That is, corresponding film layer structures of the two embodiments are similar or same; for example, a structure of the active layer 15*m* is same as a structure of the active layer 14 in the first embodiment.

Alternatively, a structure of the gate electrode 131*m* may be a monolithic structure.

Figure 6:
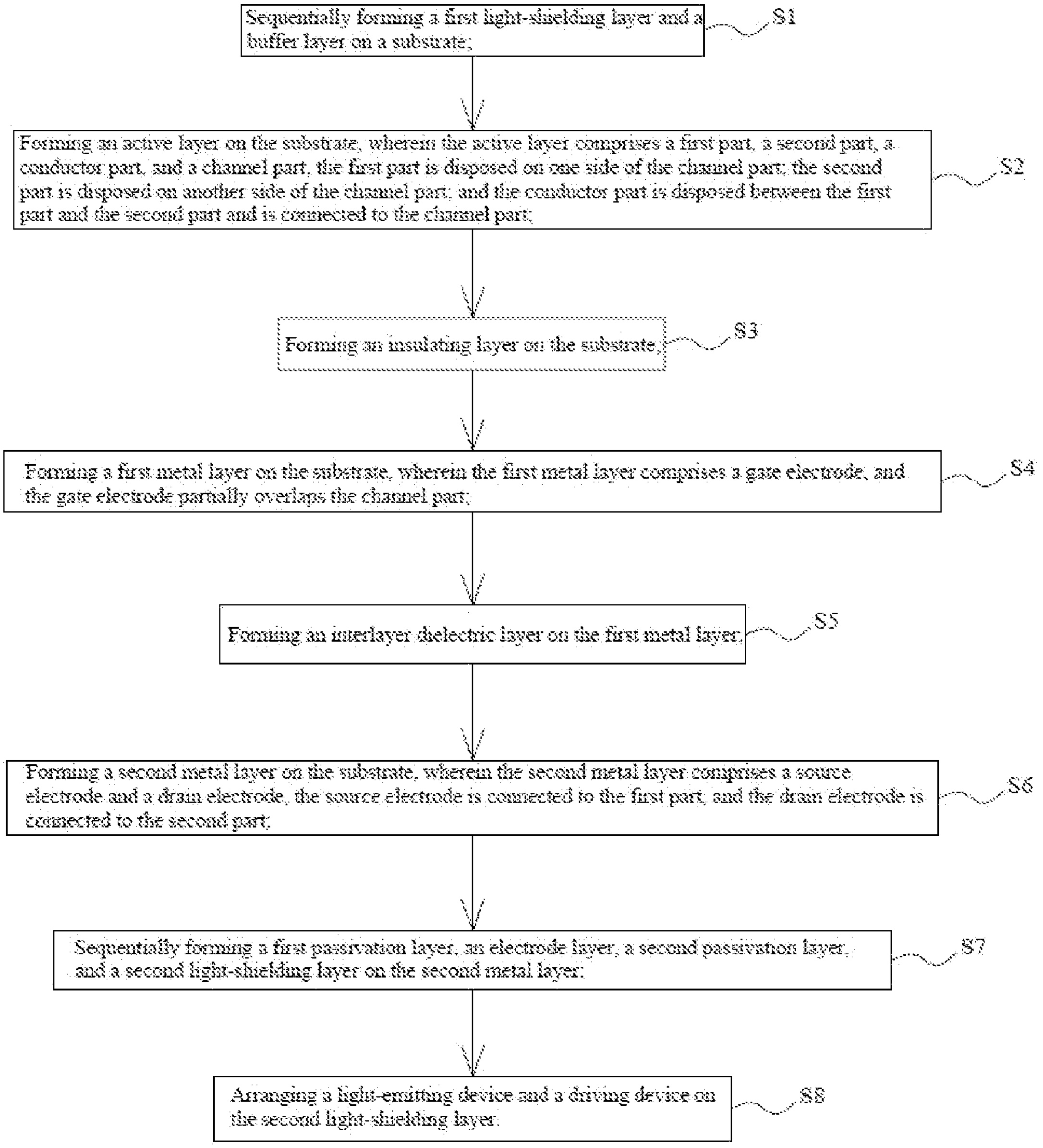
FIG. 6 is a flowchart of a method of manufacturing a display panel in accordance with an embodiment of the present invention.

Referring to FIG. 6, FIG. 6 is a flowchart of a method of manufacturing a display panel in accordance with an embodiment of the present invention. Correspondingly, the embodiment of the present invention further provides a method of manufacturing the display panel, which comprises following steps:

Step S1, sequentially forming a first light-shielding layer and a buffer layer on a substrate;

Step S2, forming an active layer on the substrate, wherein the active layer comprises a first part, a second part, a conductor part, and a channel part; the first part is disposed on one side of the channel part; the second part is disposed on another side of the channel part; and the conductor part is disposed between the first part and the second part and is connected to the channel part;

Step S3, forming an insulating layer on the substrate;

Step S4, forming a first metal layer on the substrate, wherein the first metal layer comprises a gate electrode, and the gate electrode partially overlaps the channel part;

Step S5, forming an interlayer dielectric layer on the first metal layer;

Step S6, forming a second metal layer on the substrate, wherein the second metal layer comprises a source electrode and a drain electrode, the source electrode is connected to the first part, and the drain electrode is connected to the second part;

Step S7, sequentially forming a first passivation layer, an electrode layer, a second passivation layer, and a second light-shielding layer on the second metal layer; and Step S8, arranging alight-emitting device and a driving device on the second light-shielding layer.

In a method of manufacturing a display panel of this embodiment, the display panel 100 of the first embodiment is taken as an example for description, but it is not limited thereto.

The method of manufacturing the display panel of this embodiment uses the gate electrode as a mask and conducts conductorizing treatment on the channel not blocked by the gate electrode, so as to narrow a width of the channel, thereby achieving an effect of improving electron mobility.

The method of manufacturing the display panel of this embodiment shall be described below.

Figure 7:
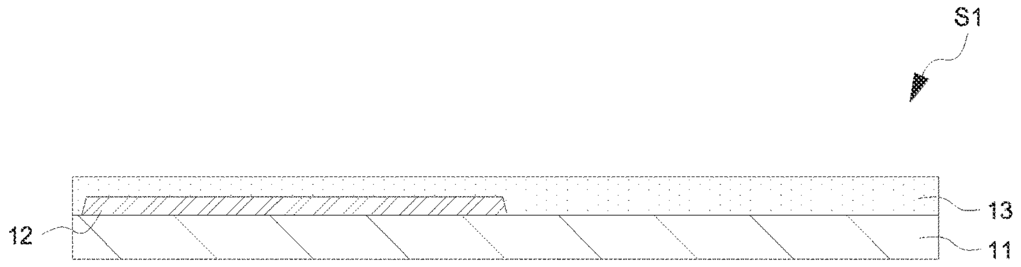
FIG. 7 is a schematic structural view of step S1 in the method of manufacturing the display panel in accordance with the embodiment of the present invention.

Referring to FIG. 7, in step S1, the first light-shielding layer 12 and the buffer layer 13 are sequentially formed on the substrate 11.

Specifically, a physical vapor deposition method may be applied to deposit a metal layer on the substrate 11, and then a photolithography process may be applied to pattern the metal layer to form the first light-shielding layer 12; then a chemical vapor deposition method may be applied to form the buffer layer 13.

Alternatively, the metal layer is etched by using a hydrogen peroxide solution as an etchant to form the first light-shielding layer 12.

Alternatively, the substrate 11 may be a rigid substrate or a flexible substrate, such as a glass substrate or a polyimide substrate. The first light-shielding layer 12 is used for shielding the active layer 14 in the subsequent process. A material of the first light-shielding layer 12 may be molybdenum (Mo) or a molybdenum copper (Mo/Cu) lamination.

Then proceed to step S2.

Figure 8:
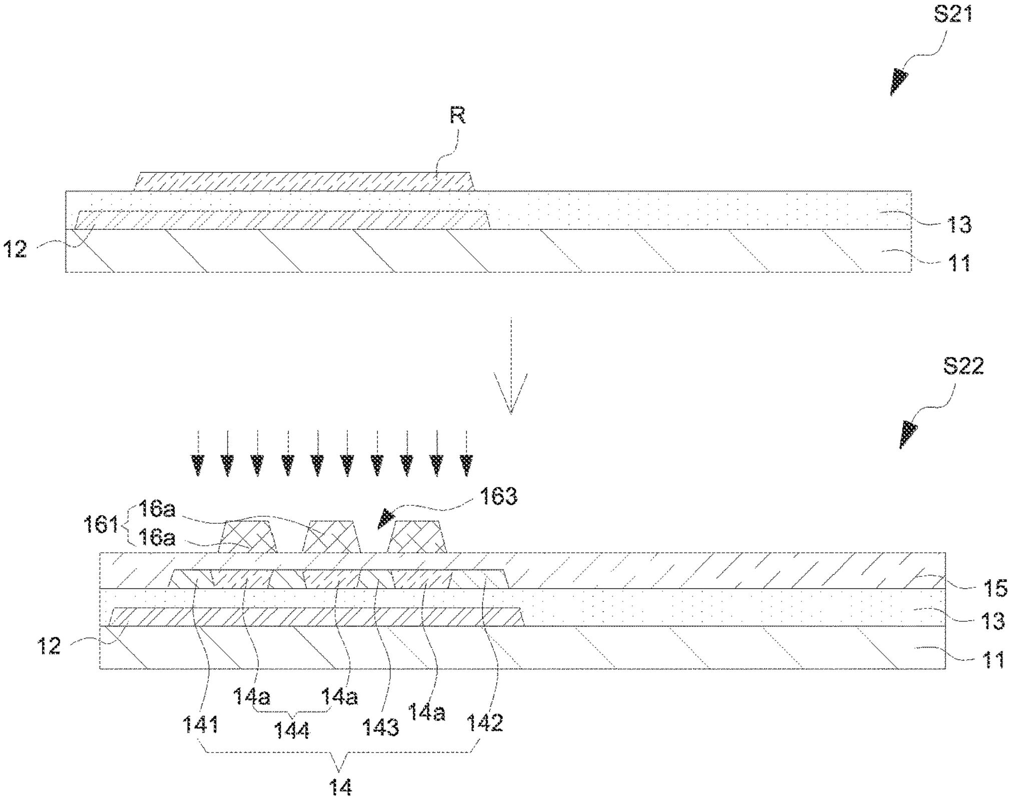
FIG. 8 is a schematic structural view of step S2 in the method of manufacturing the display panel in accordance with the embodiment of the present invention.

Referring to FIG. 8, in step S2, the active layer 14 is formed on the substrate 11. The active layer 14 comprises a first part 141, a second part 142, a conductor part 143, and a channel part 144. The first part 141 is disposed on one side of the channel part 144, and the second part 142 is disposed on another side of the channel part 144. The conductor part 143 is disposed between the first part 141 and the second part 142 and is connected to the channel part 144.

Specifically, the step S2 comprises following steps:

Step S21, depositing a metal oxide layer on the substrate 11, and patterning the metal oxide layer to form a metal oxide patterned layer R. Specifically, a physical vapor deposition method may be applied to deposit a metal oxide layer, and then a photolithography process may be applied to process the metal oxide layer to form the metal oxide patterned layer R.

When the metal oxide layer is processed by the photolithography process, an oxalic acid-based chemical solution or a hydrofluoric acid-based chemical solution can be used as an etchant for etching the metal oxide layer.

Then, proceed to step S3, step S4, and step S22 in sequence.

Step S22, using the gate electrode 161 as a mask, and conductorizing the metal oxide patterned layer R to form the active layer 14. The openings 163 correspond to the conductor part 143. The channel part 144 corresponds to the gate electrode 161. The first part 141 is disposed on one side of the channel part 144, and the second part 142 is disposed on another side of the channel part 144.

Specifically, the metal oxide patterned layer R may be irradiated with laser to conductorize a portion of the metal oxide patterned layer R corresponding to the openings 163 and a portion disposed on both sides of the gate electrode 161, so as to form the conductor part 143, the first part 141, the second part 142, and the channel part 144.

That is, using the gate electrode 161 as a mask, the laser is irradiated on the gate electrode 161, wherein a portion of the metal oxide patterned layer R shielded by the gate electrode 161 forms the channel part 144, and an exposed portion of the metal oxide patterned layer R is conductorized to form the first part 141, the second part 142, and the conductor part 143.

Alternatively, an energy density of the laser ranges from 100 to 250 $mJ/cm^2$. Alternatively, the energy density of the laser is 100 $mJ/cm^2$, 150 $mJ/cm^2$, 200 $mJ/cm^2$, or 250 $mJ/cm^2$. This setting ensures that the energy of the laser is sufficient to break the metal-oxidation bond without damaging the channel.

In this embodiment, the active layer 14 is subjected to conductorizing treatment except for the parts connecting the source electrode 181 and the drain electrode 182, so as to form the conductor part 143, thereby reducing a width of the channel part 144, and further realizing a process of narrowing the channel of the thin film transistor.

In addition, by using the conductor part 143 to divide the channel part 144 into a plurality of relatively independent sub-channels 14*a* and overlapping the sub-gate electrode 16*a* and the sub-channel 14*a*, signal transmission efficiency and stability between the source electrode 181 and the drain electrode 182 are improved.

Alternatively, a material of the active layer 14 comprises metal oxides, such as indium gallium zinc oxide, indium gallium tin oxide, and indium gallium zinc tin oxide. A thickness of the active layer 14 ranges from 400 angstroms to 800 angstroms. Alternatively, the thickness of the active layer 14 is 400 angstroms, 500 angstroms, 600 angstroms, 700 angstroms, or 800 angstroms.

Figure 9:
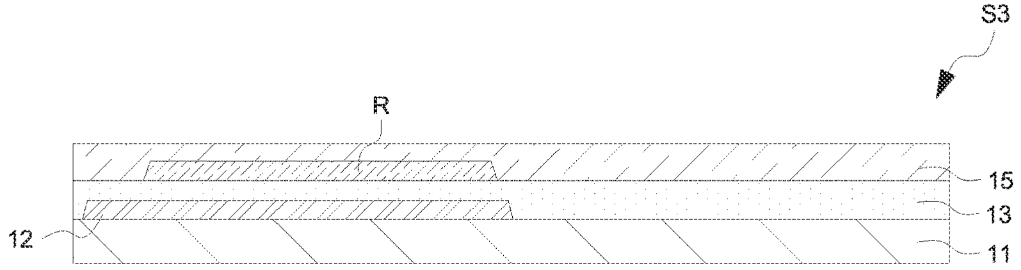
FIG. 9 is a schematic structural view of step S3 in the method of manufacturing the display panel in accordance with the embodiment of the present invention.

Referring to FIG. 9, in step S3, the insulating layer 15 is formed on the substrate 11. Alternatively, the insulating layer 15 is formed by chemical vapor deposition. The insulating layer 15 covers the metal oxide patterned layer R and the buffer layer 13. The insulating layer 15 can be made of $SiO_x$, $SiO_x/SiN_x$ lamination or $SiO_x/SiN_x/Al_2O_3$ lamination, and its thickness ranges from 2000 angstroms to 5000 angstroms. Alternatively, the thickness of the insulating layer 15 is 2000 angstroms, 3000 angstroms, 3500 angstroms, 4000 angstroms, and 5000 angstroms.

Then proceed to step S4.

Figure 10:
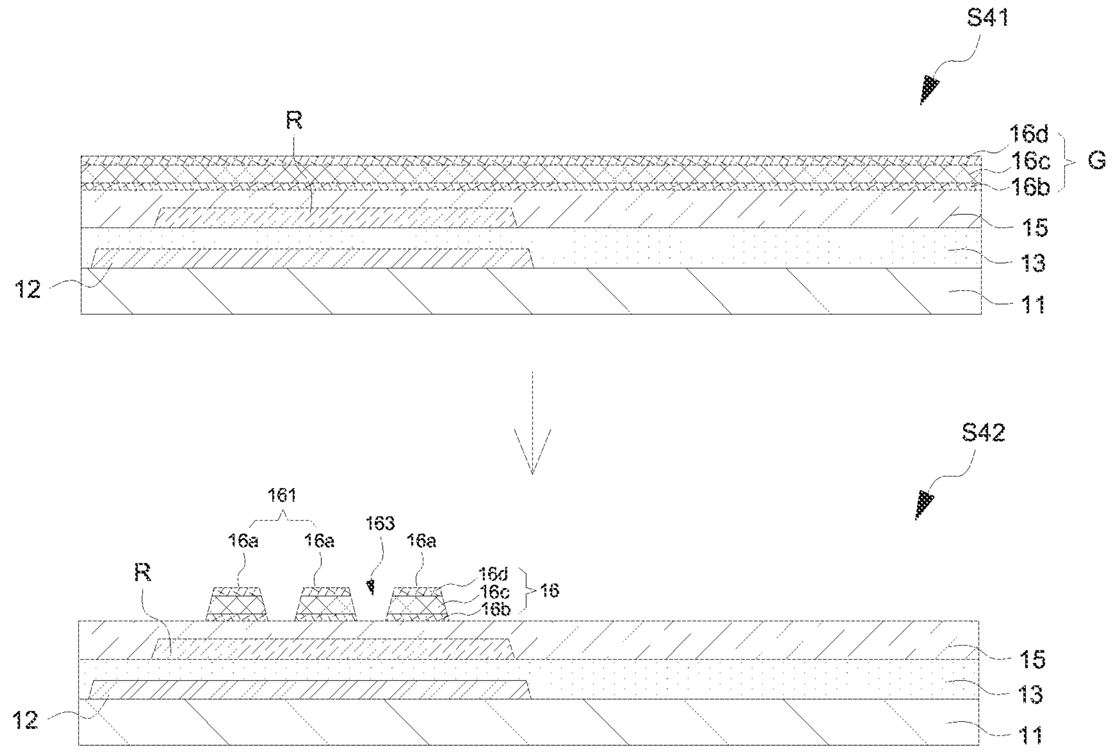
FIG. 10 is a schematic structural view of step S4 in the method of manufacturing the display panel in accordance with the embodiment of the present invention.

Referring to FIG. 10, in step S4, the first metal layer 16 is formed on the substrate 11. The first metal layer 16 comprises a gate electrode 161. The gate electrode 161 and the channel part 144 are overlapped.

Specifically, the step S4 comprises following steps:

Step S41, depositing a metal layer G on the substrate 11;

Alternatively, the metal layer G is deposited on the insulating layer 15 using a chemical vapor method.

In addition, the metal layer G may comprise a first sublayer 16*b*, a second sublayer 16*c*, and a third sublayer 16*d* laminated in sequence. Chemical potentials of the first sublayer 16*b* and the third sublayer 16*d* are both greater than a chemical potential of the second sublayer 16*c*, so that the metal layer G can be etched in subsequent processes. Then, proceed to step S42.

Step S42, the metal layer G is patterned by a wet etching process or a metal lift-off process to form the first metal layer 16. As shown in FIG. 2, the first metal layer 16 comprises a gate electrode 161 and a scan line 162. The gate electrode 161 is connected to the scan line 162. The gate electrode 161 is defined with openings 163.

Specifically, a patterned photoresist layer is formed on the metal layer G first, and then an exposed metal layer G is etched with an etching solution; the first sublayer 16*b* and the second sublayer 16*c* form a primary cell in etching solution, and the second sublayer 16*c* and the third sublayer 16*d* form another primary cell in the etching solution, thereby suppressing an etching rate of the second sublayer 16*c* and reducing an etching amount of the metal layer G; and finally, the photoresist layer is removed to form the first metal layer 16 in which the first sub-layer 16*b*, the second sub-layer 16*c*, and the third sub-layer 16*d* are laminated.

Alternatively, the etching solution at this stage is a hydrogen peroxide solution.

Alternatively, materials of the first sublayer 16*b* and the third sublayer 16*d* are selected from one of molybdenum (Mo), titanium (Ti), or nickel (Ni), or an alloy of any two thereof. A material of the second sub-layer 16*c* may be copper (Cu) or other metals.

Alternatively, the thicknesses of the first sublayer 16*b* and the third sublayer 16*d* are both less than the thickness of the second sublayer 16*c*. This arrangement meets the requirement of low resistance of the scan lines 162 and other wirings.

Alternatively, the gate electrode 161 comprises at least two sub-gate electrodes 16*a*. The opening 163 is arranged between two adjacent sub-gate electrodes 16*a*. The sub-gate electrodes 16*a* overlap the channel part 144 in a subsequent process. The scan line 162 is connected to the at least two sub-gate electrodes 16*a*.

The openings 163 separate the gate electrode 161 into at least two relatively independent sub-gate electrodes 16*a*, thereby forming a segmented gate electrode 161, which facilitates subsequent processes of forming the conductorized active layer 14 and further facilitate a connection of the source and drain signals in the thin film transistor.

Figure 11:
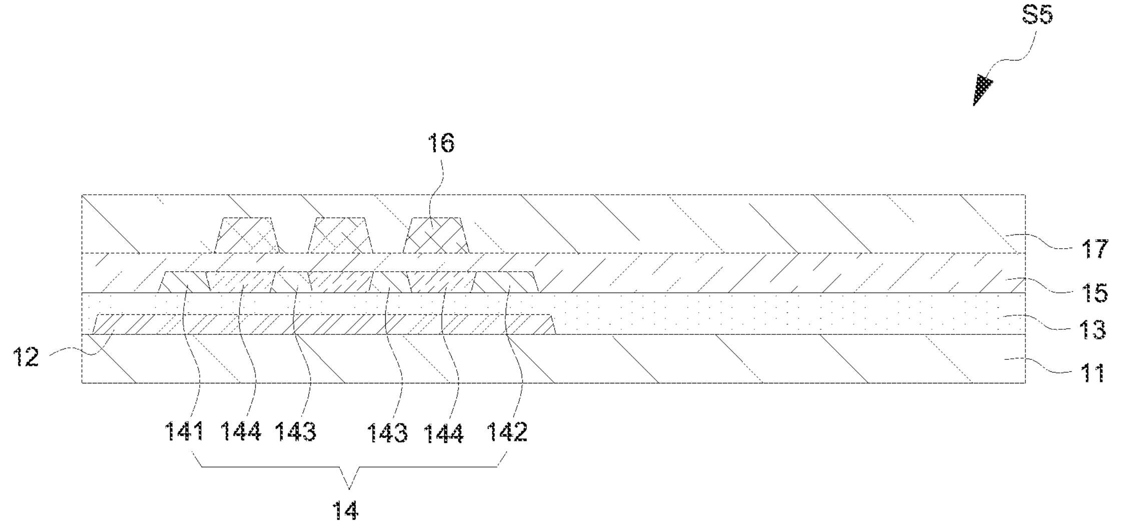
FIG. 11 is a schematic structural view of step S5 in the method of manufacturing the display panel in accordance with the embodiment of the present invention.

Referring to FIG. 11, in step S5, the interlayer dielectric layer 17 is formed on the first metal layer 16. Alternatively, the interlayer dielectric layer 17 is formed by chemical vapor deposition. Then, proceed to step S5.

Figure 12:
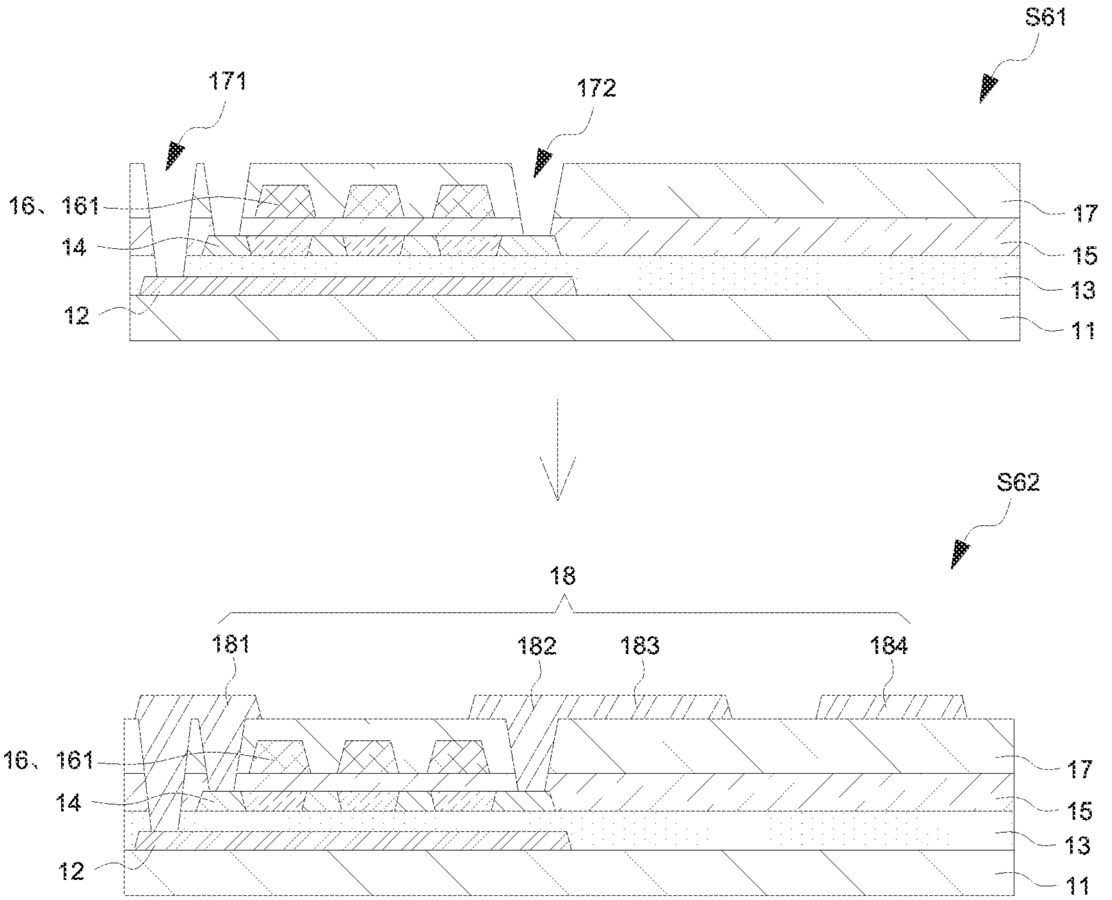
FIG. 12 is a schematic structural view of step S6 in the method of manufacturing the display panel in accordance with the embodiment of the present invention.

Referring to FIG. 12, in step S6, the second metal layer 18 is formed on the substrate 11. The second metal layer 18 comprises a source electrode 181, a drain electrode 182, a conductive pad 183, and a terminal pad 184. The source electrode 181 is connected to the first part 141, and the drain electrode 182 is connected to the second part 142.

Specifically, the step S6 comprises following steps:

Step S61, etching the interlayer dielectric layer 17, the insulating layer 15, and the buffer layer 13 by fluorine-based oxidizing gas to form a first via hole 171 exposing the first light-shielding layer 12 and two second via holes 172 exposing the first part 141 and the second part 142.

Alternatively, the interlayer dielectric layer 17, the insulating layer 15, and the buffer layer 13 are hollowed out sequentially by two photolithography processes, and the first via hole 171 and the second via holes 172 are formed by etching with a fluorine-based oxidizing gas.

Alternatively, the fluorine-based oxidizing gas comprises gases such as nitrogen trifluoride and carbon tetrafluoride.

Step S62, depositing a metal layer on the interlayer dielectric layer 17 to fill the first via hole 171 and the second via holes 172, and patterning the metal layer to form the second metal layer 18. The source electrode 181 is electrically connected to the first light-shielding layer 12 through the first via hole 171.

Alternatively, a photolithography process is applied to pattern the metal layer at this stage, and a hydrogen peroxide solution is used as an etchant for the metal layer.

The source electrode 181 is connected to the first part 141 through one of the second via holes 172, and the drain electrode 182 is connected to the second part 142 through another one of the second via holes 172. The conductive pad 183 is electrically connected to the drain electrode 182. The conductive pad 183 is used to bond the light-emitting device. The terminal pad 184 is used to bond a chip on film or a driving chip.

Then proceed to step S7.

Figure 13:
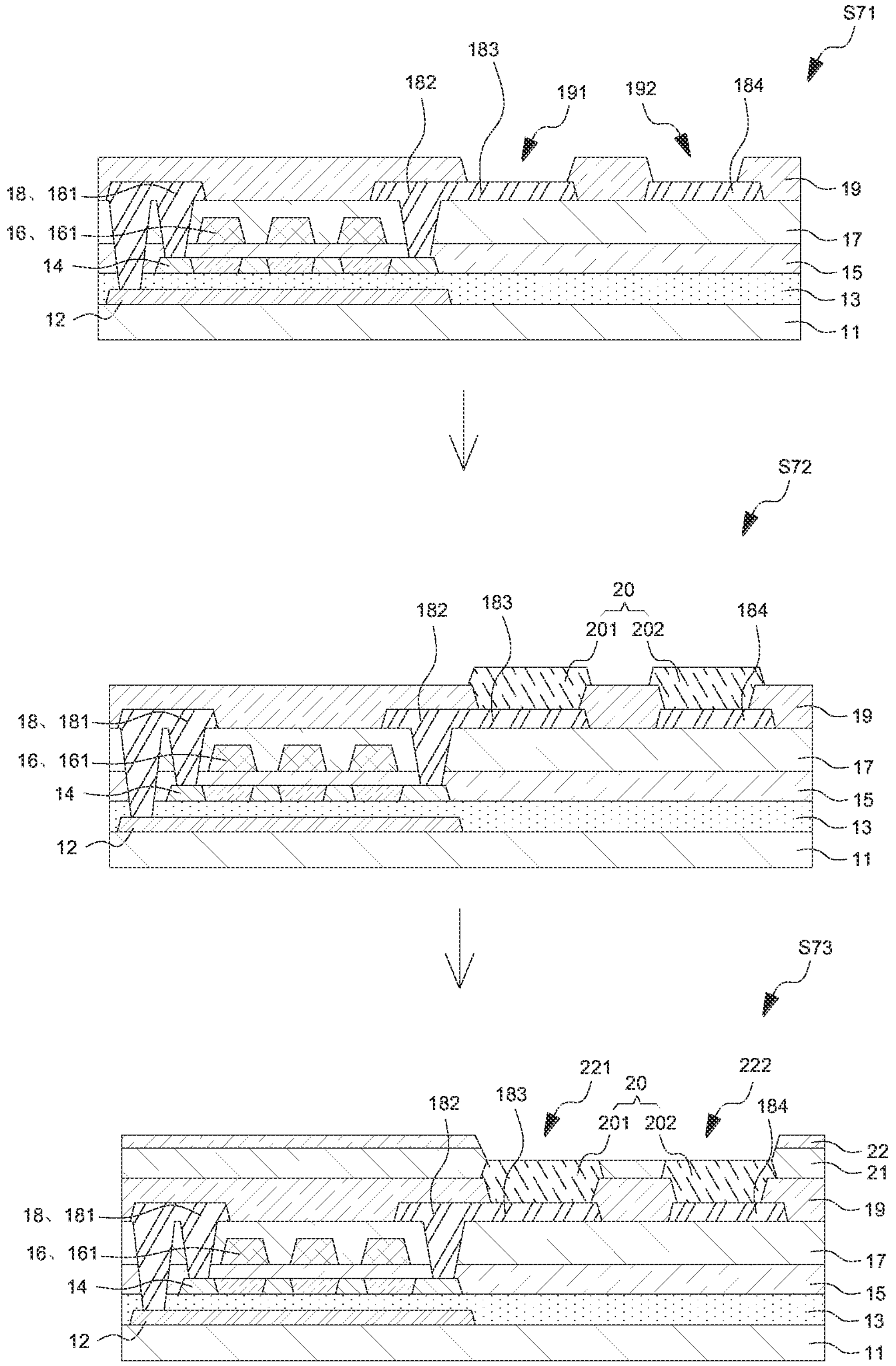
FIG. 13 is a schematic structural view of step S7 in the method of manufacturing the display panel in accordance with the embodiment of the present invention.

Referring to FIG. 13, in step S7, the first passivation layer 19, the electrode layer 20, the second passivation layer 21, and the second light-shielding layer 22 are sequentially formed on the second metal layer 18.

The step S7 comprises following steps:

Step S71, forming the first passivation layer 19 on the second metal layer 18.

Alternatively, a chemical vapor method is applied to deposit an inorganic non-metal film layer material, and then a photolithography process is applied to etch the film layer and a fluorine-based gas is used as a dry etchant, so as to form the first passivation layer 19. The first passivation layer 19 is provided with a first opening 191 and a second opening 192. The first opening 191 exposes the conductive pad 183. The second opening 192 exposes the terminal pad 184.

Step S72, forming the electrode layer 20 on the first passivation layer 19.

Alternatively, a physical vapor phase method is applied to deposit an indium tin oxide layer, and then a photolithography process is applied to etch the indium tin oxide layer with an oxalic acid or hydrofluoric acid solution as an etchant, so as to form the electrode layer 20. The electrode layer 20 comprises a first electrode 201 and a second electrode 202. The first electrode 201 is disposed in the first opening 191 and connected to the conductive pad 183. The second electrode 202 is disposed in the second opening 192 and connected to the terminal pad 184.

Step S73, sequentially forming a second passivation layer 21 and a second light-shielding layer 22 on the electrode layer 20.

Alternatively, an inorganic non-metal film layer material and a light-shielding material layer are sequentially deposited on the electrode layer 20, and the light-shielding material layer is patterned to form the second light-shielding layer 22. Then, using the second light-shielding layer 22 as a mask, the inorganic non-metal film material is etched to form the second passivation layer 21. The second passivation layer 21 is defined with a third opening 221 and a fourth opening 222. The third opening 221 exposes the first electrode 201. The fourth opening 222 exposes the second electrode 202.

Materials of the first passivation layer 19 and the second passivation layer 21 can be inorganic non-metal film material of $SiO_x$, $SiO_x/SiN_x$ lamination, or $SiO_x/SiN_x/Al_2O_3$ lamination.

Then, proceed to step S8.

Figure 14:
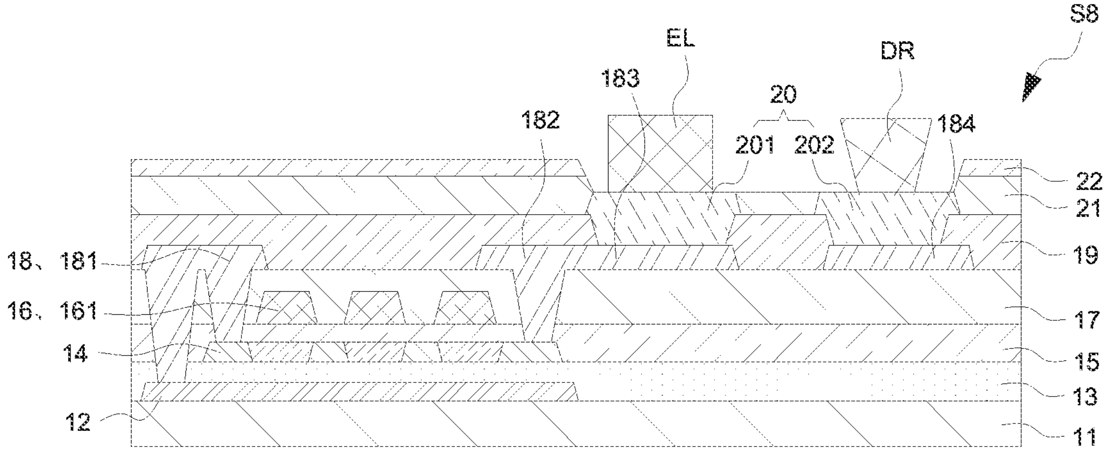
FIG. 14 is a schematic structural view of step S8 in the method of manufacturing the display panel in accordance with the embodiment of the present invention.

Referring to FIG. 14, step S8, the light-emitting device EL and the driving device DR are arranged on the second light-shielding layer 22.

Alternatively, a solder paste is coated at the third opening 221, and then the light-emitting device EL is bound; then a conductive glue is coated at the fourth opening 222, and the driving device DR is bound to the second electrode 202 through the conductive layer.

Thus, the manufacturing process of the display panel of this embodiment is completed.

In the embodiments of the present invention, the channel of the active layer is subjected to a conductorizing treatment so as to form a conductor part, thereby reducing a width of the channel part, and further realizing a process of narrowing the channel of the active layer.

The display panel and method of manufacturing same provided in the embodiments of the present invention are described in detail above. The principle and implementations of the present invention are described in this specification by using specific examples. The description about the foregoing embodiments is merely provided to help understand the method and core ideas of the present invention. In addition, those skilled in the art can make modifications in terms of the specific implementations and application scopes according to the ideas of the present invention. Therefore, the content of this specification shall not be construed as a limit to the present invention.

What is claimed is:

1. A display panel, comprising:

a substrate;

an active layer disposed on the substrate, wherein the active layer comprises a first part, a second part, a conductor part, and a channel part, the first part is disposed on one side of the channel part, the second part is disposed on another side of the channel part, the conductor part is disposed between the first part and the second part and is connected to the channel part, and a material of the active layer comprises metal oxides;

a first metal layer disposed on the substrate and disposed in a different layer from the active layer, wherein the first metal layer comprises a gate electrode, and the gate electrode overlaps the channel part; and a second metal layer disposed on the substrate and disposed in a different layer from the first metal layer, wherein the second metal layer comprises a source electrode and a drain electrode, the source electrode is connected to the first part, and the drain electrode is connected to the second part;

wherein the first metal layer comprises a first sublayer, a second sublayer, and a third sublayer laminated in sequence, and chemical potentials of the first sublayer and the third sublayer are both greater than a chemical potential of the second sublayer.

2. The display panel as claimed in claim 1, wherein a number of the conductor part is plural, and a plurality of the conductor parts are arranged in a matrix.

3. The display panel as claimed in claim 2, wherein the channel part comprises a plurality of sub-channels, and the plurality of sub-channels and the plurality of conductor parts are alternately arranged in an extending direction from the first part to the second part in the active layer.

4. The display panel as claimed in claim 3, wherein the gate electrode is defined with openings corresponding to the conductor parts; and the first metal layer further comprises a scan line, the gate electrode comprises at least two sub-gate electrodes, one of the openings is arranged between two adjacent sub-gate electrodes, the sub-gate electrodes overlap the channel part, and the scan line is connected to the at least two sub-gate electrodes.

5. A display panel, comprising:

a substrate;

an active layer disposed on the substrate, wherein the active layer comprises a first part, a second part, a conductor part, and a channel part, the first part is disposed on one side of the channel part, the second part is disposed on another side of the channel part, and the conductor part is disposed between the first part and the second part and is connected to the channel part;

a first metal layer disposed on the substrate and disposed in a different layer from the active layer, wherein the first metal layer comprises a gate electrode, and the gate electrode overlaps the channel part; and a second metal layer disposed on the substrate and disposed in a different layer from the first metal layer, wherein the second metal layer comprises a source electrode and a drain electrode, the source electrode is connected to the first part, and the drain electrode is connected to the second part;

wherein a side of the active layer facing the first metal layer is doped with fluorine-based groups.

6. The display panel as claimed in claim 5, wherein a number of the conductor part is plural, and a plurality of the conductor parts are arranged in a matrix.

7. The display panel as claimed in claim 6, wherein the channel part comprises a plurality of sub-channels, and the plurality of sub-channels and the plurality of conductor parts are alternately arranged in an extending direction from the first part to the second part in the active layer.

8. The display panel as claimed in claim 7, wherein the gate electrode is defined with openings corresponding to the conductor parts; and the first metal layer further comprises a scan line, the gate electrode comprises at least two sub-gate electrodes, one of the openings is arranged between two adjacent sub-gate electrodes, the sub-gate electrodes overlap the channel part, and the scan line is connected to the at least two sub-gate electrodes.

9. The display panel as claimed in claim 5, wherein a number of the conductor part is one.

10. The display panel as claimed in claim 5, wherein the first metal layer comprises a first sublayer, a second sublayer, and a third sublayer laminated in sequence, and chemical potentials of the first sublayer and the third sublayer are both greater than a chemical potential of the second sublayer.

11. The display panel as claimed in claim 10, wherein thicknesses of the first sublayer and the third sublayer are both less than a thickness of the second sublayer.

12. The display panel as claimed in claim 5, further comprising a first light-shielding layer, a buffer layer, an insulating layer, an interlayer dielectric layer, a first passivation layer, an electrode layer, a second passivation layer, and a second light-shielding layer;

wherein the first light-shielding layer, the buffer layer, the active layer, the insulating layer, the first metal layer, the interlayer dielectric layer, the second metal layer, the first passivation layer, the electrode layer, the second passivation layer, and the second light-shielding layer are sequentially laminated on the substrate;

wherein both the first light-shielding layer and the second light-shielding layer overlap the active layer; and wherein the second metal layer further comprises a conductive pad, one of the source electrode or the drain electrode is electrically connected to the conductive pad, the other one of the source electrode or the drain electrode is electrically connected to the first light-shielding layer, the electrode layer comprises a first electrode, and the first electrode is disposed on the conductive pad.

13. The display panel as claimed in claim 5, further comprising a buffer layer, an insulating layer, an interlayer dielectric layer, a first passivation layer, an electrode layer, a second passivation layer, and a light-shielding layer;

wherein the buffer layer, the first metal layer, the insulating layer, the active layer, the interlayer dielectric layer, the second metal layer, the first passivation layer, the electrode layer, the second passivation layer, and the light-shielding layer are sequentially laminated on the substrate; and wherein the light-shielding layer and the active layer are overlapped, the second metal layer further comprises a conductive pad, the conductive pad is electrically connected to the source electrode or the drain electrode, the electrode layer comprises a first electrode, and the first electrode is disposed on the conductive pad.

14. A method of manufacturing a display panel, comprising steps of:

forming an active layer on a substrate, wherein the active layer comprises a first part, a second part, a conductor part, and a channel part, the first part is disposed on one side of the channel part, the second part is disposed on another side of the channel part, and the conductor part is disposed between the first part and the second part and is connected to the channel part;

forming a first metal layer on the substrate, wherein the first metal layer is disposed in a different layer from the active layer, the first metal layer comprises a gate electrode, and the gate electrode partially overlaps the channel part; and forming a second metal layer on the substrate, wherein the second metal layer is disposed in a different layer from the first metal layer, the second metal layer comprises a source electrode and a drain electrode, the source electrode is connected to the first part, and the drain electrode is connected to the second part;

wherein a side of the active layer facing the first metal layer is doped with fluorine-based groups.

15. The method of manufacturing the display panel as claimed in claim 14, wherein forming the first metal layer on the substrate comprises following steps:

depositing a metal layer on the substrate; and patterning the metal layer by a wet etching process or a metal lift-off process to form the first metal layer, wherein the gate electrode is defined with openings.

16. The method of manufacturing the display panel as claimed in claim 15, wherein forming the active layer on the substrate comprises following steps:

depositing a metal oxide layer on the substrate and patterning the metal oxide layer to form a metal oxide patterned layer; and using the gate electrode as a mask and conductorizing the metal oxide patterned layer to form the active layer, wherein the openings correspond to the conductor part, the channel part corresponds to the gate electrode, the first part is disposed on one side of the channel part, and the second part is disposed on another side of the channel part.

17. The method of manufacturing the display panel as claimed in claim 16, wherein the metal oxide patterned layer is irradiated with laser to conductorize a portion of the metal oxide patterned layer corresponding to the openings and a portion disposed on both sides of the gate electrode, so as to form the conductor part, the first part, the second part, and the channel part.

18. The method of manufacturing the display panel as claimed in claim 16, wherein the gate electrode comprises sub-gate electrodes, and one of the openings is arranged between two adjacent sub-gate electrodes;

the channel part comprises sub-channels, and the sub-channels and the conductor part are alternately arranged in an extending direction from the first part to the second part in the active layer; and the sub-gate electrodes and the sub-channels are overlapped, and the openings correspond to the conductor part.

19. The method of manufacturing the display panel as claimed in claim 14, further comprising following steps:

sequentially forming a first light-shielding layer and a buffer layer on the substrate;

forming an insulating layer on the substrate;

forming an interlayer dielectric layer on the first metal layer; and sequentially forming a first passivation layer, an electrode layer, a second passivation layer, and a second light-shielding layer on the second metal layer;

wherein forming the second metal layer on the substrate comprises following steps:

etching the interlayer dielectric layer, the insulating layer, and the buffer layer with fluorine-based oxidizing gas to form a first via hole exposing the first light-shielding layer and two second via holes exposing the first part and the second part; and depositing a metal layer on the interlayer dielectric layer to fill the first via hole and the second via holes, and patterning the metal layer to form the second metal layer, wherein the second metal layer further comprises a conductive pad, the source electrode is electrically connected to the first light-shielding layer through the first via hole, the source electrode is connected to the first part through one of the second via holes, the drain electrode is connected to the second part through the other one of the second via holes, and the conductive pad is electrically connected to the drain electrode.

* * * * *